United States Patent [19]

Kongelbeck

[11] Patent Number: 5,150,128
[45] Date of Patent: Sep. 22, 1992

[54] IN-PHASE AND QUADRATURE CONVERSION ERROR COMPENSATOR

[75] Inventor: Knut S. Kongelbeck, Chatsworth, Calif.

[73] Assignee: Hughes Aircraft Company, Los Angeles, Calif.

[21] Appl. No.: 655,616

[22] Filed: Feb. 15, 1991

[51] Int. Cl.$^5$ .............................................. G01S 7/40
[52] U.S. Cl. .................................. 342/174; 342/194; 342/92; 342/102
[58] Field of Search .................. 342/174, 92, 194, 102

[56] References Cited

U.S. PATENT DOCUMENTS

| | | | |
|---|---|---|---|
| 4,122,448 | 10/1978 | Martin | 342/174 |
| 4,475,088 | 10/1984 | Beard | 342/194 X |
| 4,584,710 | 4/1986 | Hansen | 455/226 |
| 4,612,549 | 9/1986 | Geyer, Jr. et al. | 342/379 |
| 4,616,229 | 10/1986 | Taylor, Jr. | 342/171 |
| 4,642,642 | 2/1987 | Uurtamo | 342/165 |
| 4,833,479 | 5/1989 | Carlson | 342/194 |
| 4,876,489 | 10/1989 | Cawthorne | 342/383 |
| 4,952,940 | 8/1990 | Kuepfer | 342/174 |
| 4,994,810 | 2/1991 | Sinsky | 342/151 |

*Primary Examiner*—John B. Sotomayor
*Attorney, Agent, or Firm*—C. D. Brown; R. M. Heald; W. K. Denson-Low

[57] ABSTRACT

A system for detecting phase and gain imbalance errors in a synchronous detector. The synchronous detector (10) is assumed to have a first circuit (16) for providing a first signal representing a first sinusoidal term (e.g., a cosine term) and for providing a second signal representing a second sinusoidal term (e.g., a sine term) complementary to the first sinusoidal term, circuitry (12) for mixing an input signal with the first signal and circuitry (14) for mixing the input signal with the second signal. The system (16) for detecting phase and gain imbalance errors of the invention includes an amplitude compensation circuit (24) for detecting and correcting amplitude errors in the first and second signals and a phase compensation circuit (26) for detecting and correcting phase errors in the first and second signals. For amplitude compensation, the outputs of the amplitude and phase compensation circuits are input to first and second amplitude detector circuits (28) and (30). The outputs of the first and second amplitude detector circuits (28) and (30) are low pass filtered and subtracted to provide a first feedback signal. The first feedback signal is then used to control the gain of a variable gain amplifier (36) which in turn serves to adjust the gain of one of the sinusoidal signals accordingly. For phase compensation, the outputs of the amplitude and phase compensation circuits (24) and (26) are mixed and filtered to provide a second feedback signal. The second feedback signal is used to adjust the phase shift of a variable phase shifter (38) which in turn serves to adjust the phase shift of the second sinussoidal signal accordingly.

18 Claims, 4 Drawing Sheets

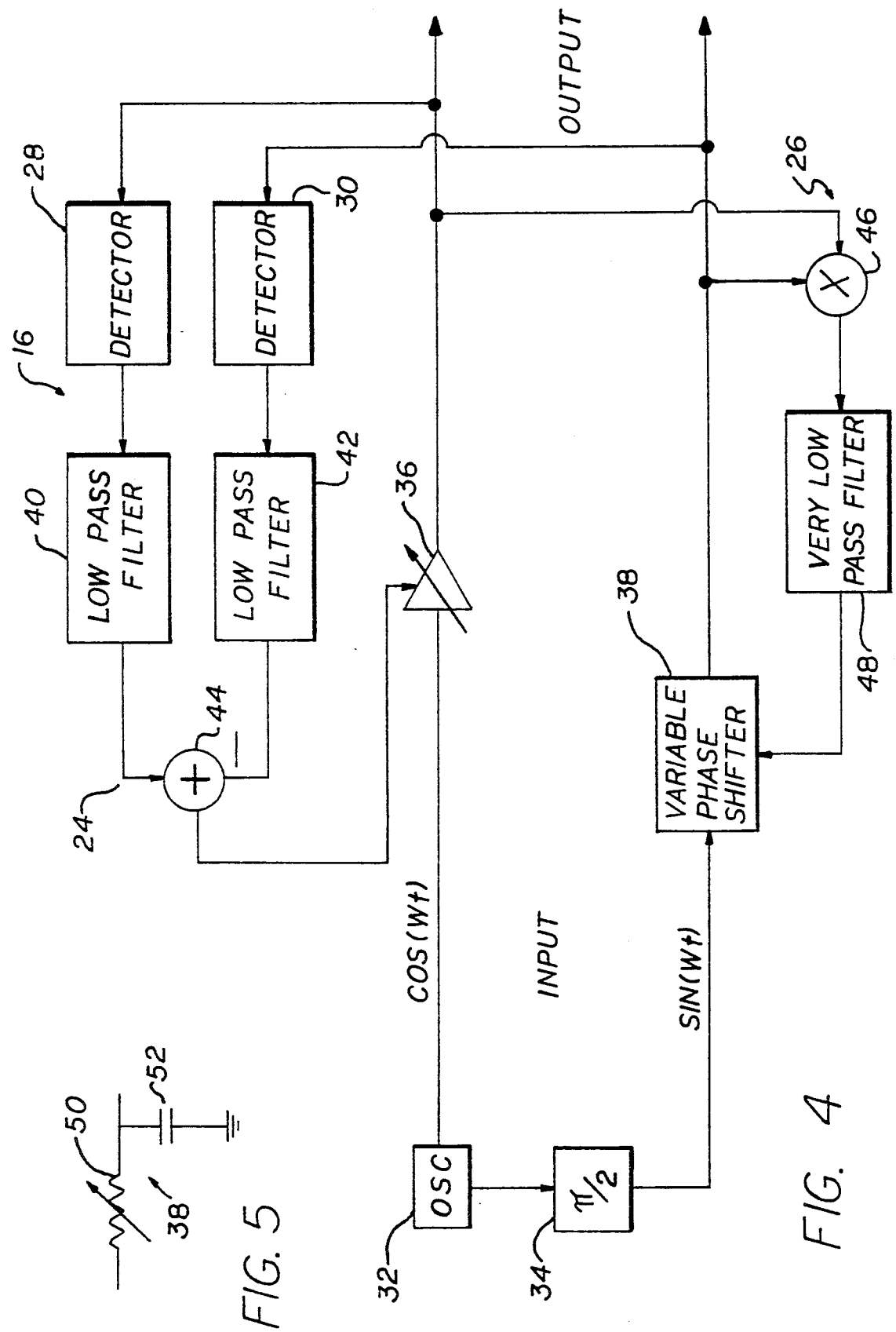

IN-PHASE AND QUADRATURE CONVERSION ERROR COMPENSATOR

BACKGROUND OF THE INVENTION

1. Field of the Invention

The present invention relates to radar signal processing. More specifically, the present invention relates to the calibration and correction of phase and gain imbalances between the in-phase (I) and quadrature (Q) outputs of a radar receiver channel.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

Coherent radars measure target velocity along the line-of-sight by determining the Doppler frequency shift of the received radar return. Typically, an I/Q synchronous detector is used to form I and Q components of the received signal. These components are then digitized and processed by a digital FFT (Fast Fourier Transform) to form narrowband Doppler filters. If a single frequency signal is input into an ideal receiver with no phase or gain errors, the signal will appear in one filter of the Doppler filter output. If the I and Q channels do not have exactly the same gain or if the phase shift between the two channels is not exactly 90 degrees, a spurious signal, usually referred to as the "image", will be generated at the output of the Doppler signal processor. The magnitude of the spurious signal is directly proportional to the gain and phase errors between the two channels. The frequency of the spurious signal is generally equal to the frequency of the true signal, but with the opposite phase rotation.

One technique for controlling the phase and gain imbalance involves the building of the radar receiver hardware in accordance with very tight specifications. For example, those skilled in the art will appreciated that to ensure that the image is 25 dB below the return signal, the gain and phase errors must be held to about 0.5 dB and 5 degrees, respectively. In applications where these tolerances must be maintained over a wide temperature range and/or where extensive measurement and trimming of circuit component values is not cost effective, additional design complexity must be added to the receiver design to ensure that the tolerances are met. The smaller the requirement for the image, the more receiver design complexity is required.

Thus, there is a need in the art for an inexpensive system and technique that would allow the phase and gain imbalance to be measured and removed in real time.

Copending U. S. Patent Application entitled System and Method for Compensation of In-phase and Quadrature Phase and Gain Imbalance, U.S. Ser. No. 07/624,951 filed Dec. 10, 1990 by John C. Conrad discloses and claims a digital system which meets the need in the art. However, this digital system, though effective, is somewhat complicated.

Thus, a need remains in the art for a simplified and inexpensive analog receiver design.

SUMMARY OF THE INVENTION

The need in the art is addressed by the present invention which provides a system for detecting phase and gain imbalance errors in a synchronous detector. The synchronous detector is assumed to have a circuit for providing a first signal representing a first sinusoidal term (e.g., a cosine term) and for providing a second signal representing a second sinusoidal term (e.g., a sine term) complementary to the first sinusoidal term, circuitry for mixing an input signal with the first signal and circuitry for mixing the input signal with the second signal. In a specific embodiment, the system for detecting phase and gain imbalance errors of the invention includes an amplitude compensation circuit for detecting and correcting amplitude errors in the first and second signals and a phase compensation circuit for detecting and correcting phase errors in the first and second signals.

In more specific embodiments, for amplitude compensation, the outputs of the amplitude and phase compensation circuits are input to first and second amplitude detector circuits. The outputs of which are low pass filtered and subtracted to provide a first feedback signal. The first feedback signal is then used to control the gain of a variable gain amplifier which in turn serves to adjust the gain of one of the sinusoidal signals accordingly.

For phase compensation, the outputs of the amplitude and phase compensation circuits are mixed and filtered to provide a second feedback signal. The second feedback signal is used to adjust the phase shift of a variable phase shifter which in turn serves to adjust the phase shift of the second of the sinusoidal signals accordingly.

Hence, through the analog feedback arrangement of the present invention, phase and gain errors between the two channels of the in-phase and quadrature conversion circuitry are separately compensated in a simple, low cost manner.

BRIEF DESCRIPTION OF THE DRAWINGS

FIG. 4 shows an illustrative implementation of the sin/cos generator 16 which provides the system for detecting phase and gain imbalance errors of the present invention.

FIG. 5 shows an illustrative implementation of the variable phase shifter.

DESCRIPTION OF THE INVENTION

Illustrative embodiments and exemplary applications will now be described with reference to the accompanying drawings to disclose the advantageous teachings of the present invention.

The purpose of I, Q conversion in many radar systems is to downconvert the bandpass signal to a video signal (containing DC) and to eliminate any negative frequency component therein. The negative frequency component is eliminated by the formation of the artificial complex signal $I(t) - jQ(t)$. In many systems this complex value is then sampled and passed through a Fast Fourier Transform (FFT) processor. If the negative frequency component is not completely canceled, it will be aliased by the sampling frequency.

For example, if the input signal is a sinusoid at the frequency $f_{if}+f_{sig}$ and is multiplied by a cos function of frequency $f_{if}$ it will have Fourier components at $+f_{sig}$ and $-f_{sig}$. If this signal were then sampled at frequency $f_s$ and passed through an FFT, frequency components would appear at $f_{sig}$ and $f_s-f_{sig}$. The last component is referred to as the image. If the complex signal $I(t)-jQ(t)$ were input to the FFT, only the $f_{sig}$ signal would appear.

When there are errors in the I, Q conversion, the image component will not be perfectly canceled. The image to signal ratio can be expressed by:

$$|R|^2 = [(r^2+1) - r\cos(\delta)] / [(r^2+1) + r\cos(\delta)]$$

where:
R = image/signal ratio,
r = gain of I channel/gain of Q channel where the amplitudes of the sin and cos terms are considered as part of channel gain, and
δ = phase difference between the I and Q channels. This includes the phase difference between the I and Q channel circuitry plus the error from quadrature of the two down converting signals.

Figure 1:
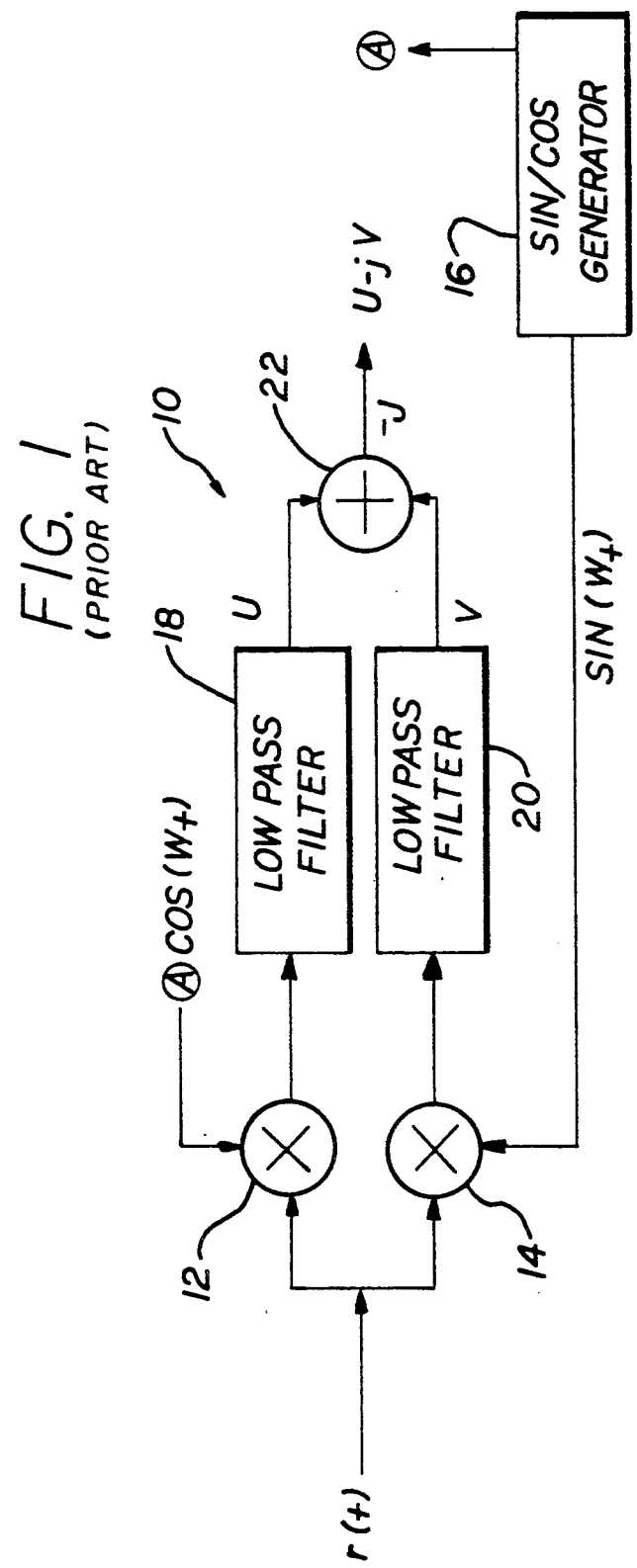
FIG. 1 shows a typical implementation of an in-phase and quadrature conversion subsystem.

FIG. 1 shows a typical implementation of an in-phase and quadrature conversion subsystem 10. The subsystem 10 includes first and second mixers 12 and 14 in parallel I and Q channels which mix a bandpass input signal r(t) with first and second sinusoidal signals representing cosine and sine terms $\cos(W_t)$ and $\sin(W_t)$ respectively to provide first and second mixed signals.

The first and second sinusoidal signals are provided by a sin/cos generator 16. Typically, the sin/cos generator includes an oscillator, from which one signal is provided, the output of which is phase shifted to provide the other signal. However, as discussed more fully below, the sin/cos generator 16 of the present invention includes means for compensating for amplitude and phase errors in the I and Q signals.

The subsystem 10 further includes first and second low pass filters 18 and 20 which filter the first and second mixed signals respectively to remove the higher frequency product term. The filtered signals are input to an adder 22 with the Q channel multiplied by −j where j is the square root of −1 to provide the desired quad output of the form U−jV.

Figure 2:
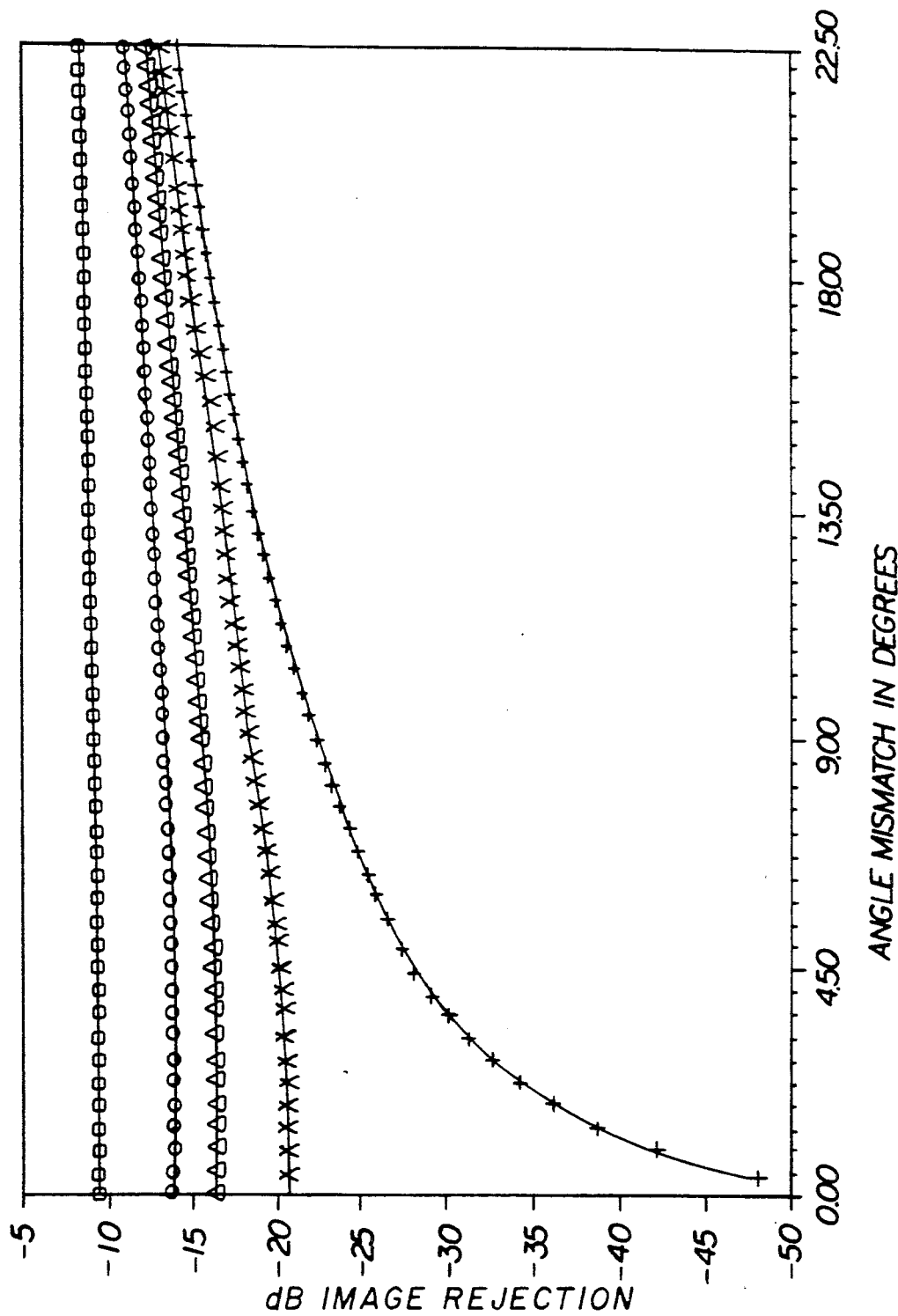
FIG. 2 shows a plot of the power ratio of the image and signal components of a conventional I, Q conversion subsystem as a function of gain and phase mismatch.
Figure 3:
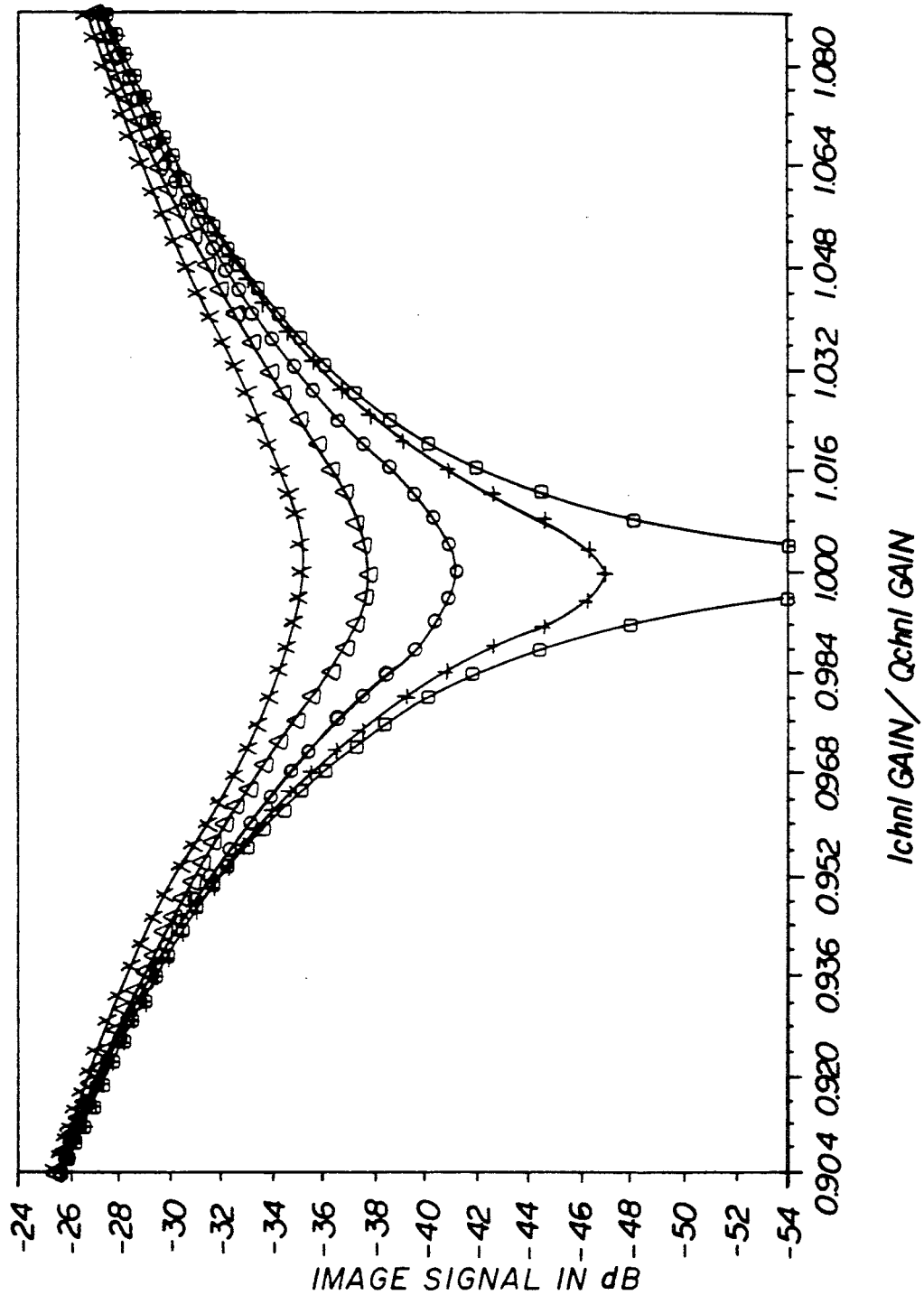
FIG. 3 shows a plot of the power ratio of the image and signal components of a conventional I, Q conversion subsystem as a function of gain ratio.

FIG. 2 shows a plot of the power ratio of the image and signal components of a conventional I, Q conversion subsystem as a function of gain and phase mismatch. FIG. 3 shows a plot of the power ratio of the image and signal components of a conventional I, Q conversion subsystem as a function of gain ratio. As can be seen, the errors can be significant. The problem is that large jammer or clutter signal images can be easily mistaken for targets.

FIG. 4 shows an illustrative implementation of the sin/cos generator 16 which provides the system for detecting phase and gain imbalance errors of the present invention. The sin/cos generator 16 includes an amplitude compensator 24 and a phase compensator 26.

Gain is compensated by simply detecting the sin and cos signals and subtracting the integrated DC values and applying this as a control signal to an AGC circuit. Hence, the amplitude compensator 24 includes first and second detectors 28 and 30 for detecting the amplitude of first and second signals representing the sine and cosine terms provided by an oscillator 32 and a 90 degree phase shifter 34, respectively, through a variable gain amplifier 36 and a variable phase shifter 38, respectively. That is, the output of the variable gain amplifier 36 is provided to the first amplitude detector 28 and the output of the variable phase shifter is provided to the second amplitude detector 30. First and second low pass filters 40 and 42 are provided for filtering the output of the first and second amplitude detectors 28 and 30 to extract third and fourth signals representing the low frequency components of the amplitude detected first and second signals respectively. A subtractor 44 is provided for subtracting the outputs of the first and second filters 40 and 42 to provide a first feedback signal. The feedback signal is provided to the variable gain amplifier 36 and used to control the gain factor thereof.

The outputs of the variable gain amplifier 36 and the variable phase shifter 38 are also mixed in a mixer 46 and filtered in a low pass filter 48 to extract low frequency components and provide a second feedback signal. The second feedback signal is input to the variable phase shifter and used to control the phase shift thereof.

FIG. 5 shows an illustrative implementation of the variable phase shifter 38. As shown, the variable phase shifter 38 may be implemented with an in-line variable resistor 50 and a parallel capacitor 52.

Thus, the present invention has been described herein with reference to a particular embodiment for a particular application. Those having ordinary skill in the art and access to the present teachings will recognize additional modifications, applications and embodiments within the scope thereof. Specifically, those skilled in the art will appreciate alternative implementations for many of the elements of the illustrative circuit shown and appropriate design values therefore to suit a given application without departing from the scope of the present teachings.

It is therefore intended by the appended claims to cover any and all such applications, modifications and embodiments within the scope of the present invention.

Accordingly,

What is claimed is:

1. A system for detecting phase and gain imbalance errors in a synchronous detector having first means (32) for providing a first signal representing a first sinusoidal term, second means (32,34) for providing a second signal representing a second sinusoidal term complementary to said first sinusoidal term, means for mixing (12) an input signal with said first signal and means for mixing (14) said input signal with said second signal, said system for detecting phase and gain imbalance errors comprising:
    means for detecting (28, 30) amplitude errors in said first and second signals;
    means for correcting (44, 36) amplitude errors in said first and second signals and providing an output signal in response thereto;
    means for detecting (46, 48) phase errors in said first and second signal; and
    means for correcting (38) said phase errors in said first and second signals and providing an output signal in response thereto.

2. The invention of claim 1 wherein said means for detecting amplitude errors in said first and second signals includes means for detecting the amplitude of said first and second signals.

3. The invention of claim 2 wherein said means for detecting amplitude errors in said first and second signals further includes first (40) and second (42) low pass filter means for filtering the output of said means for detecting the amplitude of said first and second signals to extract third and fourth signals representing the low frequency components of the amplitude detected first and second signals respectively 4. The invention of claim 3 wherein said means for detecting amplitude errors in said first and second signals further includes means for subtracting (44) the outputs of said first and second filter means to provide a feedback signal.

5. The invention of claim 4 wherein said means for correcting amplitude errors in said first and second signals includes variable gain amplifier 36 means for amplifying said first signal with a variable gain factor in response to said feedback.

6. The invention of claim 1 wherein said means for detecting phase errors in said first and second signals includes means for mixing (46) said first and second signals to provide a mixed output signal.

7. The invention of claim 6 wherein said means for detecting phase errors in said first and second signals further includes low pass filter means f(48) for extracting low frequency components of said mixed signals and providing a feedback signal.

8. The invention of claim 7 wherein said means for detecting phase errors in said first and second signals further includes variable phase shifter (38) means for phase shifting said second signal in response to said feedback signal.

9. A system for detecting phase and gain imbalance errors in a synchronous detector having first means (32) for providing a first signal representing a first sinusoidal term, second means (32, 34) for providing a second signal representing a second sinusoidal term complementary to said first sinusoidal term, means for mixing (12) an input signal with said first signal and means for mixing (14) said input signal with said second signal, said system for detecting phase and gain imbalance errors comprising:
    amplitude compensation means (24) including means for detecting (28, 30) amplitude errors in said first and second signals and means for correcting (44, 36) amplitude errors in said first and second signals providing an output signal in response thereto and
    phase compensation means (26) including means for detecting (46, 48) phase errors in said first and second signals and means for correcting (38) said phase errors in said first and second signals and providing an output signal in response thereto.

10. The invention of claim 9 wherein said means for detecting amplitude errors in said first and second signals includes means for detecting (28, 30) the amplitude of said first and second signals.

11. The invention of claim 10 wherein said means for detecting amplitude errors in said first and second signals further includes first and second low pass filter means (40, 42) for filtering the output of said means for detecting the amplitude of said first and second signals to extract third and fourth signals representing the low frequency components of the amplitude detected first and second signals respectively.

12. The invention of claim 11 wherein said means for detecting amplitude errors in said first and second signals further includes means for subtracting (44) the outputs of said first and second filter means to provide a feedback signal.

13. The invention of claim 12 wherein said means for correcting amplitude errors in said first and second signals includes variable gain amplifier (36) means for amplifying said first signal with a variable gain factor in response to said feedback.

14. The invention of claim 9 wherein said means for detecting phase errors in said first and second signals includes means for mixing (46) said first and second signals to provide a mixed output signal.

15. The invention of claim 14 wherein said means for detecting phase errors in said first and second signals further includes low pass filter means (48) for extracting low frequency components of said mixed signals and providing a feedback signal.

16. The invention of claim 15 wherein said means for detecting phase errors in said first and second signals further includes variable phase shifter (38) means for phase shifting said second signal in response to said feedback signal.

17. In a missile radar signal processing system, a system for detecting phase and gain imbalance errors in a synchronous detector having first means (32) for providing a first signal representing a first sinusoidal term, second means (32, 34) for providing a second signal representing a second sinusoidal term complementary to said first sinusoidal term, means for mixing (12) an input signal with said first signal and means for mixing (14) said input signal with said second signal, said system for detecting phase and gain imbalance errors comprising:
    amplitude compensation means (24) including means for detecting (28, 30) amplitude errors in said first and second signal sand means for correcting (44, 36) amplitude errors in said first and second signal sand providing a first output signal in response thereto and
    phase compensation means (26) including means for detecting (46, 48), phase errors in said first and second signals and means for correcting (38) said phase errors in said first and second signals and providing a second output signal in response thereto,
    said means for detecting amplitude errors in said first and second signals including:
    means for detecting (28, 30) the amplitude of said first and second signals,
    first and second low pass filter means (40, 42) for filtering the output of said means for detecting the amplitude of said first and second signals to extract third and fourth signals representing the low frequency components of the amplitude detected first and second signals respectively, and
    means for subtracting (44) the outputs of said first and second filter means to provide a first feedback signal,
    said means for correcting amplitude errors in said first and second signals including variable gain amplifier means (36) for amplifying said first signal with a variable gain factor in response to said first feedback signal, and
    said means for detecting phase errors in said first and second signals including:
    means for mixing (46) said first and second signals to provide a mixed output signal, low pass filter means (48) for extracting low frequency components of said mixed signals and providing a second feedback signal, and variable phase shifter means (38) for phase shifting said second signal in response to said second feedback signal.

18. A method for detecting phase and gain imbalance errors in a synchronous detector having first means (32) for providing a first signal representing a first sinusoidal term, second means (32, 34) for providing a second signal representing a second sinusoidal term complementary to said first sinusoidal term, means for mixing (12) an input signal with said first signal and means for mixing (14) said input signal with said second signal, said method for detecting phase and gain imbalance errors including the steps of:

a) detecting amplitude errors in said first and second signals;

b) correcting amplitude errors in said first and second signals providing a output signal in response thereto;

c) detecting phase errors in said first and second signals; and d) correcting said phase errors in said first and second signals and providing a output signal in response thereto.

* * * * *